United States Patent [19]

Krupke et al.

[11] Patent Number: 5,280,492
[45] Date of Patent: Jan. 18, 1994

[54] YB:FAP AND RELATED MATERIALS, LASER GAIN MEDIUM COMPRISING SAME, AND LASER SYSTEMS USING SAME

[75] Inventors: William F. Krupke, Pleasanton; Stephen A. Payne, Castro Valley; Lloyd L. Chase, Livermore; Larry K. Smith, Salida, all of Calif.

[73] Assignee: The United States Department of Energy, Washington, D.C.

[21] Appl. No.: 792,792

[22] Filed: Nov. 15, 1991

[51] Int. Cl.$^5$ .............................................. H01S 3/16
[52] U.S. Cl. ...................................................... 372/41
[58] Field of Search ............................... 372/41, 92

[56] References Cited

FOREIGN PATENT DOCUMENTS 1197316  7/1970  United Kingdom .

OTHER PUBLICATIONS

Morozov, et al., Spectral and Luminescent Characteristics of Fluoropatite Single Crystals Activated by Rare Earth Ions, May 28, 1970, pp. 590–596.
Fan et al., Diode Laser-Pumped Solid-State Lasers, IEEE Journal of Quantum Electronics, vol. 24, No. 6, pp. 895–912, Jun. 1988.
Berger et al., High Power, High Efficient Neodymium: Yttrium Aluminum Garnet Laser End Pumped by a Laser Diode Array, Appl. Phys. Lett. 51(16), pp. 1212–1214.
Suni et al., 1-mJ/pulse Tm:YAG Laser Pumped by a 3-W Diode Laser, Optics Letters, vol. 16, No. 11, pp. 817–819, Jun. 1, 1991.
Killinger, Phonon-assisted Unconversion in 1.64-$\mu$m Er:YAG Lasers, Digest of Tech. Papers, paper THJ4, p. 240, CLEO, 1987.
Bour et al., Two-Dimensional Array of High-Power Strained Quantum Well Lasers with $\lambda = 0.95$ $\mu$m, Appl. Phys. Lett. 54(26), pp. 2637–2638, Jun. 26, 1989.
Krupke, et al., Ground-State Depleted Solid-State Lasers: Principles, Characteristics and Scaling, Optical and Quantum Elect., 22 (1990) S1–S21.
Reinberg et al., GaAs:Si LED Pumped Yb-Doped YAG Laser, Applied Physics Letters, vol. 19, No. 1, pp. 11–13, Jul. 1, 1971.
Lacovara et al., Room-Temperature Diode-Pumped Yb:YAG Laser, Optics Letters, vol. 16, No. 14, pp., 1089–1091, Jul. 15, 1991.
Stoneman et al., Laser-Pumped 2.8 $\mu$m Er3+:GSGG Laser, Digest of Technical Papers, paper CTu06, pp. 134–135, CLEO 1991.
Storm et al., Single Mode Lasing of Ho:Tm:YAG at 2.091 Mircrons in a Monolithic Crystal, Adv. Solid-State Lasers, Tech. Digest, Mar. 5–7, 1990, Utah.
Kane et al., Diode-Pumped Single-Frequency Lases and Q-Switched Laser Using Tm: YAG and Tm,Ho:YAG, OSA Processings on Adv. Solid-State Lasers, vol. 6, 1990, Utah.
Prener, The Growth and Crystallographic Properties of Calcium Fluor-and Chlorapatite Crystals, Solid State Science, vol. 114, No. 1, pp. 77–83, 1/67.
Ohlmann et al., Spectroscopic and Laser Characteristics of Neodymium-Doped Calcium Fluorophosphate, Applied Optics, vol. 7, No. 5, pp. 905–914, May 1968.

Primary Examiner—Rodney B. Bovernick
Assistant Examiner—Robert E. Wise
Attorney, Agent, or Firm—Henry P. Sartorio; Roger S. Gaither; William R. Moser

[57] ABSTRACT

An ytterbium doped laser material remarkably superior to all others, including Yb:YAG, comprises Ytterbium doped apatite (Yb:Ca$_5$(PO$_4$)$_3$F) or Yb:FAP, or ytterbium doped crystals that are structurally related to FAP. The new laser material is used in laser systems pumped by diode pump sources having an output near 0.905 microns or 0.98 microns, such as InGaAs and AlInGaAs, or other narrowband pump sources near 0.905 microns or 0.98 microns. The laser systems are operated in either the conventional or ground state depletion mode.

32 Claims, 5 Drawing Sheets

SPECTROSCOPIC/LASER PARAMETERS OF Yb:FAP AND Yb:YAG

| PARAMETER | VALUE | |
|---|---|---|
| | Yb:FAP* | Yb:YAG** |
| LASER WAVELENGTH, nm | 1043 | 1029 |
| FLOURESCENCE LIFETIME, msec | 1.1 | 1.1 |
| PUMP ABSORPTION CROSS-SECTION, $10^{-20}$ cm$^2$ | 6.9 | 0.80 |
| PUMP SATURATION FLUX, kW/cm$^2$ | 2.9 | 24 |
| LASER EMISSION CROSS-SECTION, $10^{-20}$ cm$^2$ | 5.9 | 2 |
| LASER SATURATION FLUENCE, J/cm$^2$ | 3.2 | 9.5 |

*FAP = Ca$_5$(PO$_4$)$_3$F   **YAG = Y$_5$Al$_3$O$_{12}$

FIG. 3

YB:FAP AND RELATED MATERIALS, LASER GAIN MEDIUM COMPRISING SAME, AND LASER SYSTEMS USING SAME

The U.S. government has rights in this invention pursuant to Contract Number W-7405 ENG-48 between the U.S. Department of Energy and the University of California for the operation of Lawrence Livermore National Laboratory.

BACKGROUND OF THE INVENTION

1. Field of the Invention

The present invention relates to a new material useful as an ytterbium doped laser gain medium, and to laser systems using the same.

2. Description of Related Art

In recent years, high-power efficient semiconductor laser diodes and diode arrays have been used to great practical benefit as pump sources for solid state lasers. T. Y. Fan and R. L. Byer, "Diode Pumped Solid State Lasers", IEEE J. Quantum Electronics, 24, 895 (1988). The vast majority of this work has involved AlGaAs diode pump sources emitting in the 780–810 nm range to pump rare earth doped solid state laser materials including neodymium (J. Berger, D. F. Welch, D. R. Scifres, W. Streifer, and P. S. Cross, "High Power, High Efficiency Neodymium:Yttrium Aluminum Garnet Laser End Pumped by a Laser Diode Array", Appl. Phys, Lett., 51, 1212 (1987)), thulium (P. J. M. Suni and S. W. Henderson, "1-mJ/Pulse Tm:YAG Laser Pumped by a 3 Watt Diode Laser", Opt. Letters, 16, 817 (1991)), holmium (T. J. Kane and T. S. Kubo, "Diode-Pumped Single-Frequency Lasers and Q-switched Laser Using Tm:YAG and Tm,Ho:YAG", Proceedings on Advanced Solid State Lasers, 6, 136 (1990)), and erbium (D. K. Killinger, "Phonon-assisted Upconversion in 1.64 Micron Er:YAG Lasers", Digest of Technical Papers, Paper THJ4, p240 CLEO, 1987). In the past year or so, powerful and efficient InGaAs diode arrays emitting in the 900–1100 nm region have become available (D. P. Bour, P. Stabile, A. Rosen, W. Janton, L. Elbaum, and D. J. Holmes, "Two-Dimensional Array of High Power Strained Quantum Well Lasers with Wavelength of 0.95 Microns", Appl. Phys. Lett , 54, 2637 (1989)) opening up the possibility of pumping a solid state laser using ytterbium ($Yb^{3+}$) as the laser active ion (W. F. Krupke and Lloyd L. Chase, "Ground-state depleted Solid-State-Lasers: Principles, Characteristics, and Scaling", Opt. and Quantum Electronics, 22, S1 (1990)) (as well as providing an alternative diode pump source for erbium lasers). Part of the current intense interest in diode pumped Yb lasers accrues to the fact that the energy-storage lifetime of the $Yb^{3+}$ laser ions is typically in excess of a millisecond compared to a few hundred microseconds for the $Nd^{3+}$ ion. This longer lifetime lowers the diode array power required to produce a given degree of energy storage in the laser material which results in a correspondingly lower cost for the pump array.

The first demonstration of a Yb solid state laser pumped by a narrowband source was published by Reinberg, et al.. in 1971 (A. R. Reinberg, L. A. Riseberg, R. M. Brown, R. W. Wacker, and W. C. Holton, "GaAs:Si LED Pumped Yb-Doped YAG Laser", Appl. Phys. Lett., 19, (1971)). Ytterbium doped yttrium aluminum garnet (Yb:YAG) was used as the solid state laser material; it was pumped at a wavelength near 940 nm using GaAs:Si light-emitting diodes (LEDs). Silicon doping was used to shift the pump light to about 940 nm from about 860 nm, typical of undoped GaAs LEDs. The Yb:YAG crystal was cooled to a temperature near 77° K. to reduce resonant loss at the laser wavelength (1029 nm). The pump LEDs were also cooled to 77° K. to increase LED power and efficiency. The need to operate this laser at cryogenic temperatures discouraged interest in this device and no practical or commercial use ensued.

With the recent emergence of highly practical diodes and diode arrays operating in the 900–1100 nm region (D. P. Bour, P. Stabile, A. Rosen, W. Janton, L. Elbaum, and D. J. Holmes, "Two-Dimensional Array of High Power Strained Quantum Well Lasers with Wavelength of 0.95 Microns", Appl. Phys. Lett., 54, 2637 (1989)), a renewal of interest in designing and building practical Yb solid state lasers occurred (W. F. Krupke and Lloyd L. Chase, supra). Additionally, Krupke and Chase described a method (so-called "ground state depletion mode") by which the deleterious effects of resonance loss which compromise the practical utility of the Yb:YAG laser could be substantially overcome at room temperature by properly designing and utilizing intense, narrowband pump sources, such as an appropriately intensified laser diode array (W. F. Krupke and Lloyd L. Chase, supra). In 1991, Lacovara, et al.. reported the demonstration of a room temperature Yb:YAG laser pumped with a broad-stripe InGaAs laser diode (P. Lacovara, H. K. Choi, C. A. Wang, R. L. Aggarwal, and T. Y. Fan, "Room-Temperature Diode-Pumped Yb:YAG Laser", Opt. Letters, 16, 1089 (1991)). Although operated at room temperature, the experimental arrangement did not incorporate a sufficiently intense diode pump, in the manner described by Krupke and Chase supra) which would have mitigated the deleterious effects due to resonance absorption loss, and which would have allowed a considerably higher performance (efficiency, etc.) to be achieved.

Based on our analyses, the Yb:YAG material gain system falls far short of possessing the spectroscopic/laser parameters which will permit the superior room temperature operation possible in a more ideal Yb-solid state laser gain medium. Specifically, the pump absorption cross-section of Yb:YAG (about $0.8 \times 10^{-20} cm^2$) is quite low and necessitates using a Yb doping level greater than $10^{20}$ ions/cc in order to obtain efficient absorption of pump light. This relatively high doping level introduces a proportionally higher resonance absorption loss at the laser wavelength, increasing the threshold pump power and lowering laser efficiency (when operating only several times above threshold). The undesirably low pump absorption cross-section also results in a pump saturation flux of 22 $kW/cm^2$, which severely taxes the degree of pump array intensification needed to realize the benefits of operating the Yb:YAG laser in the ground state depletion mode. Additionally, the relatively low stimulated emission cross-section of Yb:YAG (about $2 \times 10^{-20} cm^2$) results in a relatively low small signal laser gain for a given pumping flux and a relatively high saturation fluence (about 9.5 $J/cm^2$). The latter high value is uncomfortably close to the optical damage threshold of YAG (10–15 $J/cm^2$), limiting the extraction and overall laser efficiency of pulsed Yb:YAG lasers.

In view of these spectroscopic/laser parameter deficiencies of Yb:YAG for an InGaAs diode pumped solid state laser, it is desirable to provide an ytterbium doped laser gain material more suitable for commercial applications. In our survey, the most widely used laser hosts (e.g., YLF, BaY$_2$F$_8$, LaF$_3$, etc.) were found not to offer significant improvements over Yb:YAG.

SUMMARY OF THE INVENTION

The present invention provides a new material and a new article of manufacture comprising an ytterbium doped laser gain medium. The gain medium of the present invention is remarkably superior to other ytterbium doped media, including Yb:YAG. In particular, the present invention comprises a material, and a gain medium comprising the material, consisting essentially of ytterbium doped fluoroapatite (FAP) (Yb:Ca$_5$(PO$_4$)$_3$F) or Yb:FAP, or ytterbium doped crystals that are structurally related to FAP. Such crystals have the composition:

$$M_5(PO_4)_3X,$$

where

M is a divalent cation such as Ca$^{2+}$, Sr$^{2+}$, Cd$^{2+}$, or Pb$^{2+}$; or a combination of monovalent and trivalent ions, such as Li$^{1+}$, Na$^{1+}$, K$^{1+}$ or Rb$^{1+}$, and Y$^{3+}$, La$^{3+}$, Gd$^{3+}$ or Lu$^{3+}$, RE$^{3+}$ (rare earth), respectively, and X is a singly-charged anion, such as F, Cl, Br, I OH or one-half the fraction of doubly-charged anions, such as O$^{2-}$ or S$^{2-}$.

According to another aspect of the present invention, a laser gain apparatus comprises a Yb:FAP gain material, or a gain material of an ytterbium doped crystal structurally related to FAP, and a diode pump source, such as InGaAs and AlInGaAs, having an output near 0.905 microns, coupled with the gain material. Alternatively, the new laser material can be pumped by other narrowband pump sources near 0.905 microns, such as titanium sapphire or chromium-LiSAF. The laser gain apparatus may be operated in either the conventional mode or ground state depletion mode.

According to yet another aspect of the present invention, this gain apparatus can be operated beneficially in a Q-switched resonator, as a pulsed amplifier generating an output of near 1.04 microns or as some other type of resonator in which the temporal, spatial, or spectral output of the system is controlled by the use of the appropriate optics or architectures, such as is involved with mode-locking or narrowband operation.

According to yet another aspect of the present invention, an ytterbium doped gain medium is provided which has a better minimum pump intensity required to achieve gain $I_{min}$ (where the resonance gain and loss are equal), and a better emission cross-section at the laser output wavelength $\sigma_{em}$ than is provided by the most common host materials, YAG and YLF. In particular, the laser gain medium according to the present invention has a $I_{min}$ less than about 1.0 kW/cm$^2$ at near 0.905 microns and an emission cross-section $\sigma_{em}$ greater than about $2.0 \times 10^{-20}$ cm$^2$ near 1.04 microns. More Preferably, $I_{min}$ is less than about 0.3 kW/cm$^2$, and $\sigma_{em}$ is greater than about $3.0 \times 10^{-20}$ cm$^2$. In the most preferred implementation, $I_{min}$ is less than about 0.2 kW/cm$^2$ and $\sigma_{em}$ is greater than about $5.0 \times 10^{-20}$ cm$^2$.

Other aspects and advantages of the present invention can be seen upon review of the figures, the detailed description and the claims which follow.

BRIEF DESCRIPTION OF THE FIGURES

FIG. 3 is a table comparing spectroscopic and laser parameters of Yb:FAP with Yb:YAG.

DESCRIPTION OF THE PREFERRED EMBODIMENTS

Figure 6:
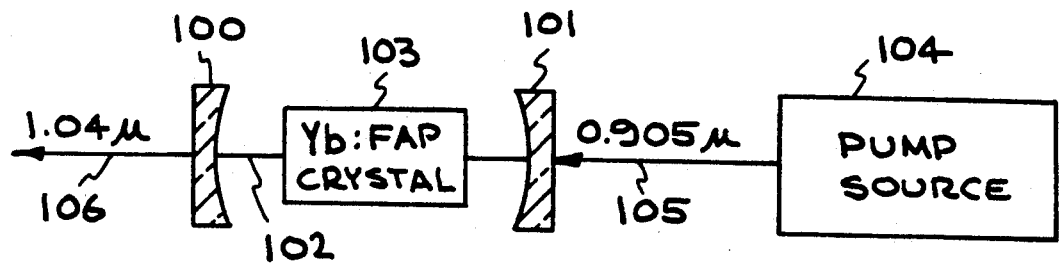
FIG. 6 is a schematic diagram of a laser resonator according to the present invention, including a Yb:FAP gain material.
Figure 7:
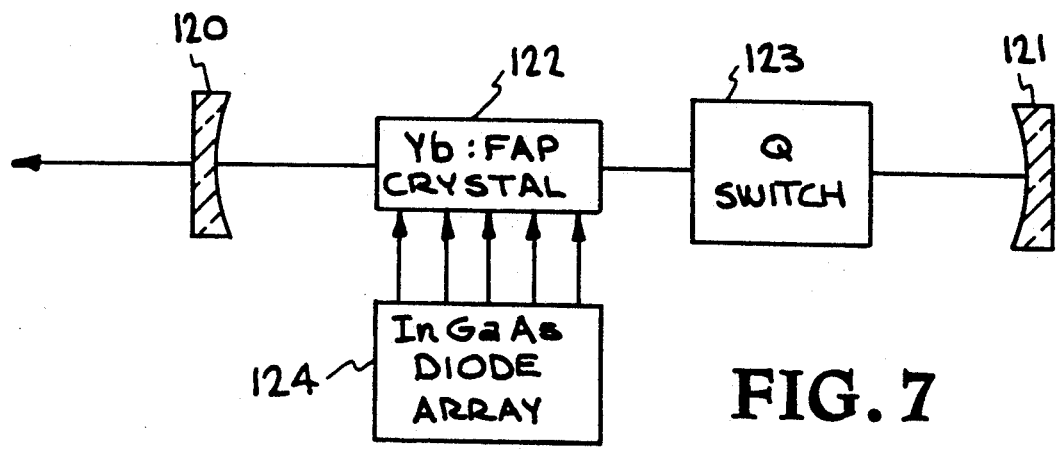
FIG. 7 is a schematic diagram of a Q-switched laser resonator according to the present invention.
Figure 8:
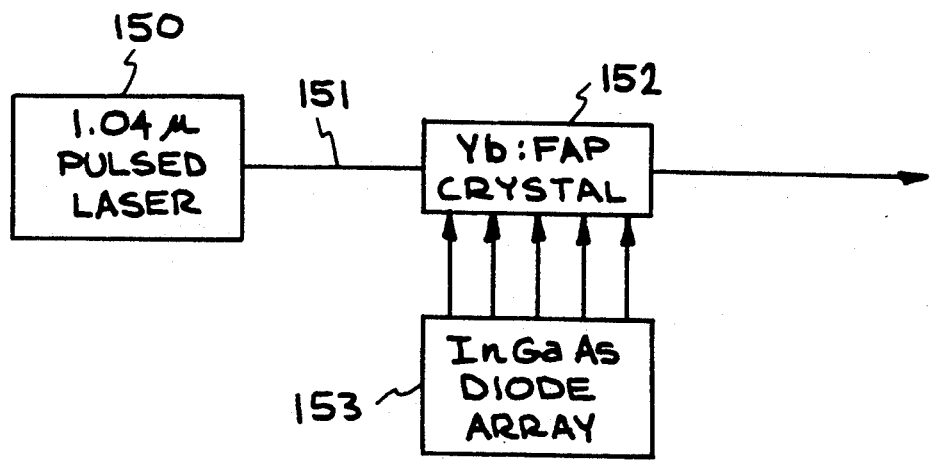
FIG. 8 is a schematic diagram of a laser amplifier including Yb:FAP gain material.

The physical characteristics of Yb:FAP and related crystals are illustrated with respect to FIGS. 1-5. Laser systems utilizing the gain material of the present invention are shown in FIGS. 6-8.

Figure 1:
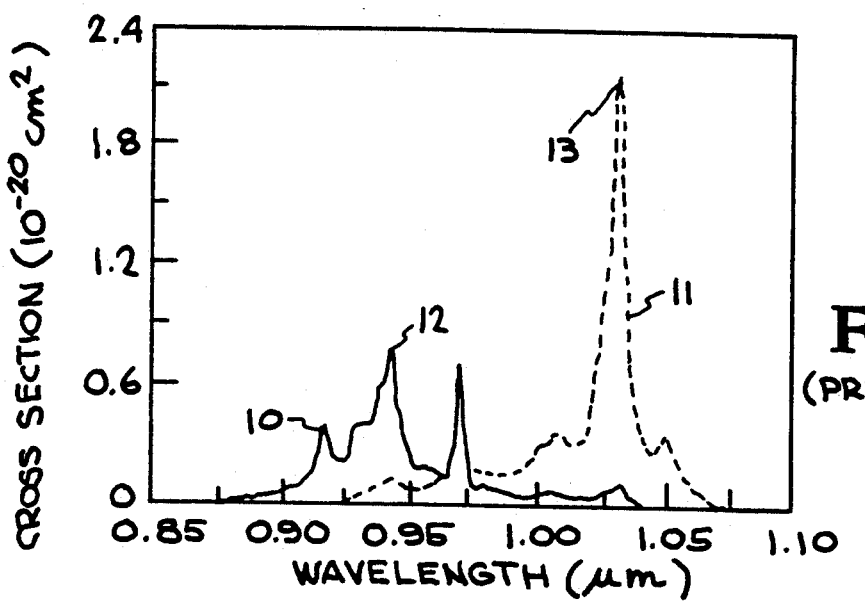
FIG. 1 is a graph of the emission and absorption cross-sections of the prior art gain material Yb:YAG.

FIG. 1 illustrates the emission and absorption spectra of the prior art gain material Yb:YAG. As can be seen, the graph includes a first trace 10 of the absorption cross-section, and a second trace 11 of the emission cross-section. The pump line for InGaAs diodes is illustrated at point 12. The laser line near 1.04 microns is illustrated at point 13.

Figure 2A:
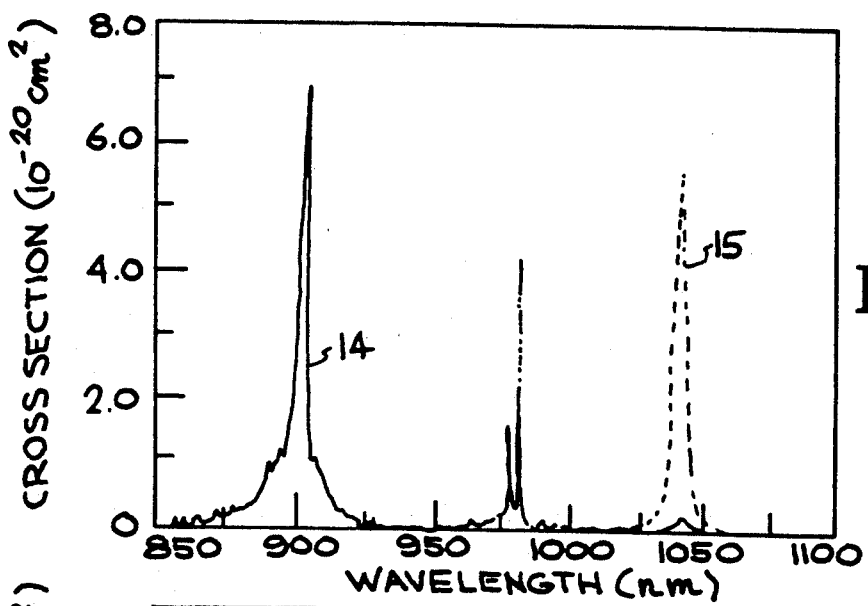
FIGS. 2A and 2B illustrate the emission and absorption spectra for Yb:FAP with the E field parallel to the c axis, and the E field perpendicular to the axis, respectively.
Figure 2B:
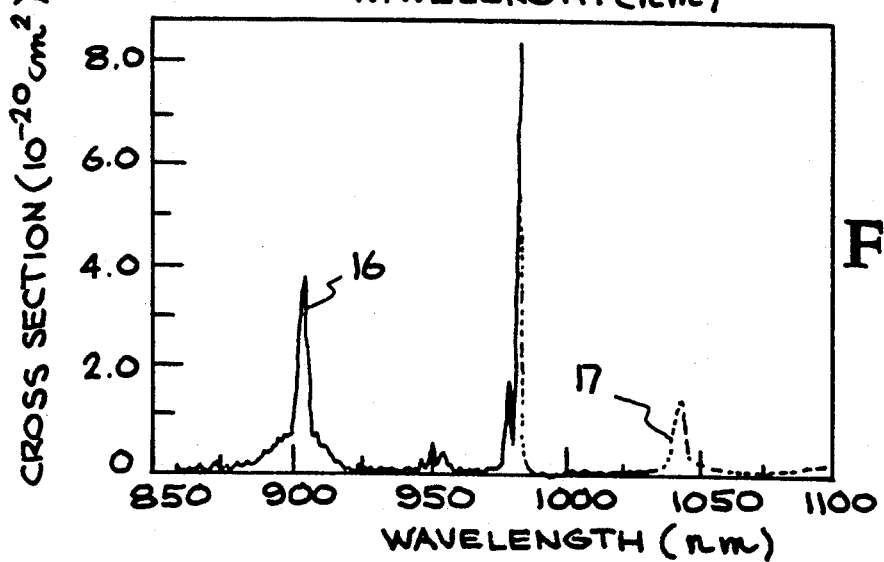

For comparison, the absorption and emission spectra of Yb:FAP are shown in FIGS. 2A and 2B, for the E field parallel to the c axis ($\pi$-polarized), and the E field perpendicular to the c axis ($\sigma$-polarized), respectively. As can be seen, FIG. 2A includes a first trace 14 illustrating the absorption cross-sections, and a second trace 5 illustrating the emission cross-sections for $\pi$-polarized beams. FIG. 2B includes a first trace 6 illustrating the absorption cross-sections, and a second trace 17 illustrating the emission cross-section for $\sigma$-polarized beams. Note that FAP is an anisotropic crystal (uniaxial) giving rise to sharply polarized spectra. The strongest absorption and emission features of Yb:FAP are $\pi$-polarized, as illustrated in FIG. 2A. In $\pi$-polarization, the pump absorption cross-section near 0.905 microns is about $6.9 \times 10^{-20}$ cm$^2$, or essentially an order of magnitude greater than the pump absorption cross-section of Yb:YAG at this wavelength. This high absorption cross-section lowers the pump saturation flux by a corresponding order of magnitude to approximately 2.8 kW/cm$^2$, greatly relieving need to intensify diode pump arrays in the design and construction of a practical and efficient room temperature Yb laser. Additionally, roughly 1/10 the doping density of Yb ions (e.g., approximately $10^{19}$ ions/cc) can be utilized in Yb:FAP while obtaining the same pump absorption coefficient as achieved in Yb:YAG containing about $10^{20}$ ions/cc. The reduced Yb content in FAP means that there will be less resonant loss at the laser wavelength, thereby reducing the pump power required to reach threshold.

FIG. 3 is a table illustrating the spectroscopic/laser parameters of Yb:FAP and Yb:YAG for the purposes of comparison.

The laser transition near 1.04 microns is strongly polarized in Yb:FAP. The stimulated emission cross-section is about $1.8 \times 10^{-20} cm^2$ in the $\sigma$-polarization (FIG. 2B) and about $5.9 \times 10^{-20} cm^2$ in the $\pi$-polarization (FIG. 2B). As can be seen, these values are comparable to and about four times larger than that of Yb:YAG, respectively. By suitably orienting the Yb:FAP laser gain crystal in relation to the directions and polarizations of the pumping beam, or beams, and the laser extraction beam, one can optimize the performance of the Yb:FAP laser such that the larger emission cross-section is accessed. To the extent that the higher stimulated emission cross-section is utilized, the saturation fluence will be lowered, thus reducing the risk of optical damage during pulsed energy extraction. Because one can effectively utilize a Yb:FAP crystal with an order of magnitude lower Yb concentration (approximately $10^{19}$ ions/cc) than is utilized for Yb:YAG, the resonance lost in Yb:FAP will still be smaller than in Yb:YAG, even for the high $\pi$-polarized laser emission cross-section.

Figure 4:
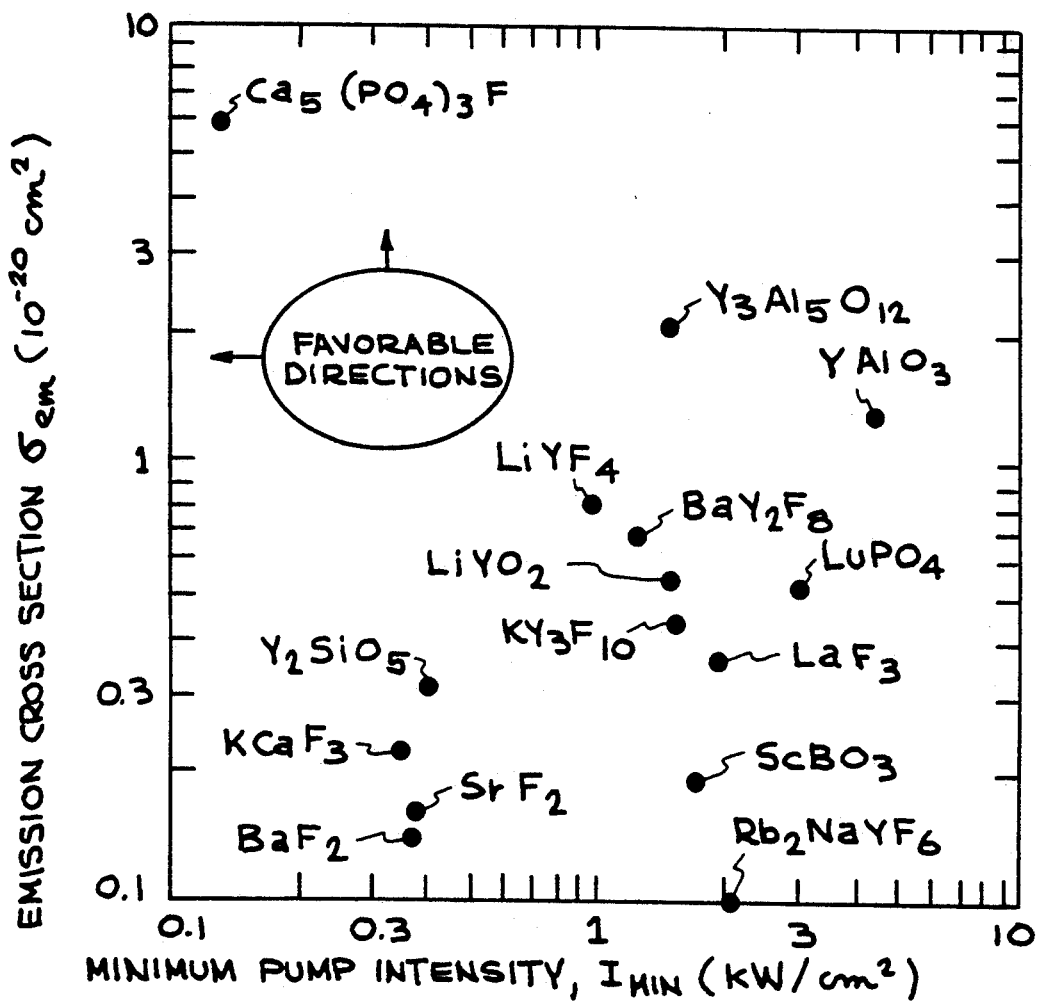
FIG. 4 is a plot of $\sigma_{em}$ v. $I_{min}$ for Yb:doped crystalline hosts, illustrating the superior characteristics of the materials according to the present invention compared to prior art materials, (reduced $I_{min}$ and large $\sigma_{em}$ are desired).

FIG. 4 is a plot of the emission cross-section $\pi_{em}$ versus minimum pump power $I_{min}$ required to achieve net gain, for a variety of Yb doped crystalline hosts, including the material of the present invention. As can be seen, YAG represents the material having the highest emission cross-section of the prior art at approximately $2 \times 10^{-20} cm^2$. LiYF$_4$ or YLF, on the other hand, represents a prior art material which has a reasonable emission cross-section and a somewhat lower minimum pump intensity $I_{min}$ at approximately $1.0 kW/cm^2$. Material according to the present invention has a greater emission cross-section ($\pi_{em} > 2 \times 10^{-20} cm^2$) than Yb:YAG, and a smaller minimum pump intensity ($I_{min} < 1.0 kW/cm^2$) than Yb:YLF. Furthermore, the present invention provides a material having a minimum pump intensity less than $0.3 kW/cm^2$ and an emission cross-section greater than $3.0 \times 10^{-20} cm^2$. In fact, the preferred material, according to the present invention, has a minimum pump intensity of less than $0.2 kW/cm^2$ and an emission cross-section greater than about $5.0$ times $10^{-20} cm^2$. Applicant is not aware of any other material which even approaches these parameters. Furthermore, it was highly unexpected that the material according to the present invention has characteristics so remarkably superior to the Yb doped crystalline hosts of the prior art. No other material has been adequately characterized to be included on this figure describing the prior art.

The crystalline host FAP, according to the present invention, is structurally related to a number of having the formula:

$$M_5(PO_4)_3X,$$

where

M is a divalent cation such as $Ca^{2+}$, $Sr^{2+}$, $Cd^{2+}$, $Pb^{2+}$; or a combination of monovalent and trivalent ions, and X is a singly-charged anion, such as F, Cl, Br, I or OH, or one-half the fraction of doubly-charged anions such as $O^{2-}$ or $S^{2-}$.

The combination of monovalent and trivalent ions may consist of, for instance, $Li^{1+}$, $Na^{1+}$, $K^{1+}$, $Rb^{1+}$, etc. and $Y^{3+}$, $La^{3+}$, $Gd^{3+}$, $Lu^{3+}$, $RE^{3+}$, etc., respectively.

These materials are characterized by crystal fields at the rare earth ion sites that are likely to give rise to polarized emission spectra that are predominantly peaked in a single spectroscopic emission feature.

Figure 5:
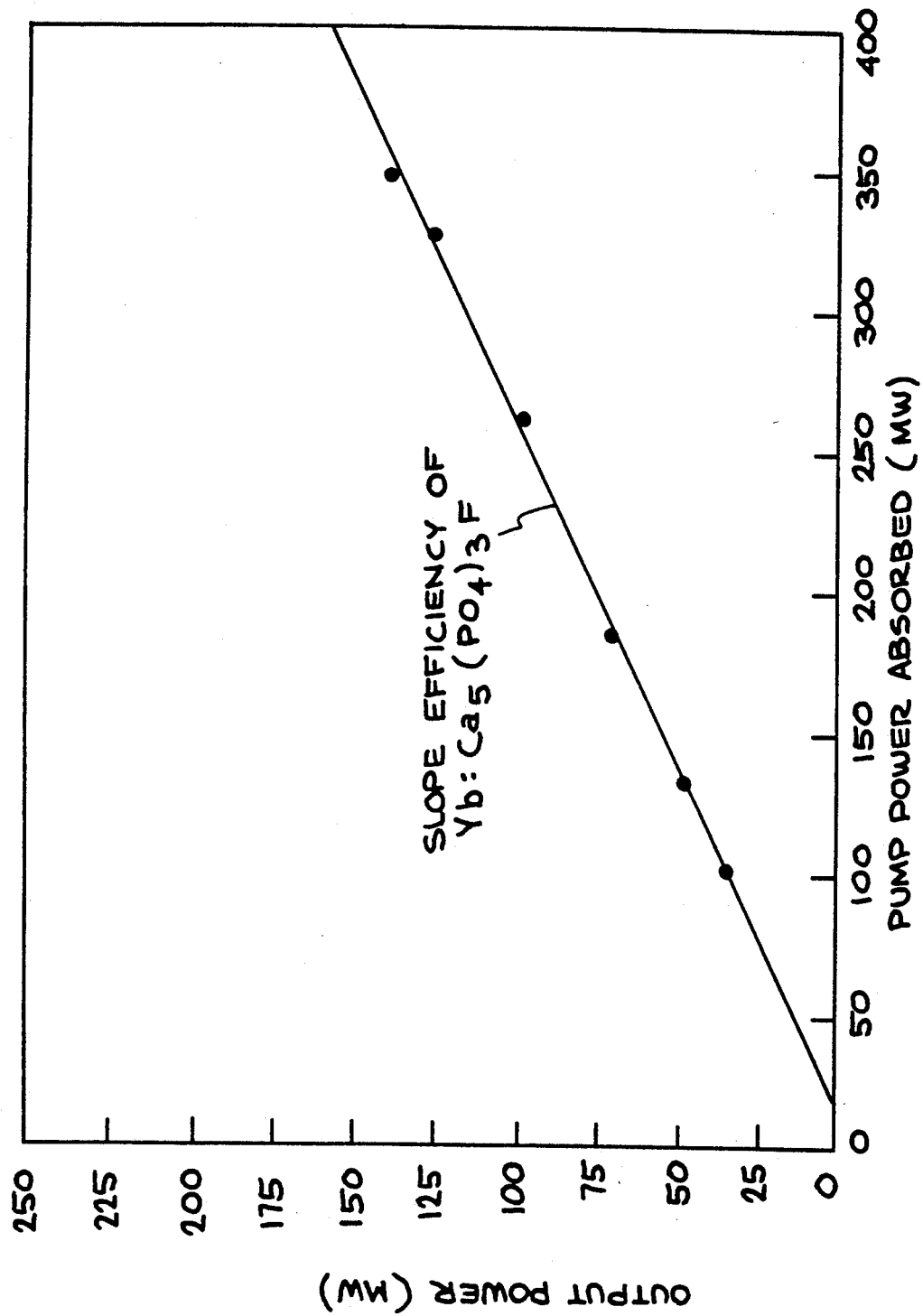
FIG. 5 is a graph illustrating the slope efficiency of a Yb:FAP laser.

FIG. 5 is a plot of the slope efficiency of a laser resonator utilizing the Yb:FAP gain material of the present invention. The resonator utilized to generate the graph of FIG. 5 is shown in FIG. 6.

FIG. 6 illustrates the experimental resonator design utilized to verify the properties of laser gain material Yb:FAP according to the present invention. The resonator includes an output coupler 100 (4.4% output coupling at 1.04 microns) and a mirror 101 defining a resonant path 102. A cubic crystal 4 mm on a side of Yb:FAP 103 was mounted in the optical path 102. A narrowband pump source 104 provided by a tunable titanium sapphire laser, delivered a 0.905 micron pump beam along path 105 longitudinally into the resonator. An output beam at approximately 1.04 microns was generated along path 106.

In the resonator of FIG. 6 output coupler 100 was a 5 cm radius mirror, approximately 96.6% reflective at 1.04 microns. Mirror 100 was a 5 cm mirror approximately 99.8% reflective at 1.04 microns. The gain medium 103 was mounted in the resonant path 102 near the focal points of the output coupler 100 and mirror 101. Mirror 101, in addition, was transmissive to the 0.0905 micron line supplied by the pump source 104.

FIG. 5 illustrates the pump power absorbed versus output power in milliwatts generated in the resonator of FIG. 6. As can be seen, with an output coupler 100 providing 4.4% output coupling, the slope efficiency is 40.8% with a threshold of 15.5 milliwatts.

The Yb:FAP crystal was prepared by the Czochralski crystal growth method. In order to manufacture the crystal, the materials were mixed in the following approximate proportion: one part $CaF_2$, six parts $CaHPO_4$, three parts $CaCO_3$, and a small amount of $Yb_2O_3$. These materials were melted by heating to approximately 1725° C. An apatite seed crystal was dipped into the mixture and turned at approximately 30 revolutions per minute while it was raised at approximately 2 mm per hour. A crystal 10 cm long by approximately 3 cm in diameter was grown, having from 0.5 to 2 atomic percent Ca replaced by Yb. The clearest section was cut out to form a cube, four mm on a side, oriented with the o axis in the plane of one of the faces. The sides were polished flat and parallel. The finished article of manufacture was used as the gain medium.

The new material therefore consists essentially of a crystal doped with Yb, such that Yb is the dominant activating ion. Portions of other rare earth ions, that do not substantially dominate the lasing characteristics of the material imparted by Yb may be present in the new material. The article of manufacture is a gain medium consisting of a crystal host manufactured in a gain medium configuration, and doped with Yb. The gain medium may be doped also with other rare earth ions as suits the needs of a particular application. The preferred gain medium is doped with essentially pure Yb.

Although the pump source 104 was provided by a titanium sapphire narrowband tunable laser in order to verify the laser gain performance of Yb:FAP, the preferred system includes an array of laser diodes such an InGaAs or AlInGaAs diodes in either a longitudinal or a transverse pumping configuration. Use of a tunable narrowband source, like Ti:Sapphire, is a scientifically accepted method of verifying the viability of a gain material for narrowband diode pumping. See, R. C. Stoneman, J. G. Lynn, and L. Esterowitz, "Laser-Pumped 2.8 Micron Er:GSGG Laser", Digest of Technical Papers, paper CTch06, p. 134, CLEO 1991. In addition, chromium:LiSAF pump sources could be used; or other narrowband pump sources at near 0.905 microns. It is also possible to pump the Yb:FAP gain medium at the other absorption features, for example, near 980 nm although this is not the preferred method. Alternatively, an incoherent pump source, such as flashlamps could be utilized to achieve laser gain in these new materials and gain media.

FIG. 7 illustrates an alternative configuration of a laser system utilizing the gain material of the present invention. In particular, the system includes an output coupler 120 and a high reflecting mirror 121. A crystal of Yb:FAP 122 is mounted in the optical path defined by the output coupler 120 and the mirror 121. A Q-switch 123 is also mounted in the optical path. The crystal of Yb:FAP 122 is pumped by an InGaAs diode array 124 in optical communication with the gain medium 122 using techniques known in the art. Optical elements (not shown) for intensifying the pump source may be used, if necessary. Because the power output of the diode array 124 is limited by the peak power which can be provided, the long storage lifetime of Yb:FAP provides a beneficial medium for diode pumping as shown in FIG. 8 with a Q-switched resonator. In the preferred system, a ground state depletion mode is induced by an appropriately intense pump source.

The gain medium 122 can be provided in a variety of shapes, such as rods, slabs, cubes, or other shapes optimized for crystal manufacturing methods, pumping configurations and resonator designs.

The Q-switch is representative of a variety of intracavity optical elements which may be used, such as non-linear optical crystals, filters, acousto-optic modulators, Pockels cells, and others. These additional optical elements may be used to perform other tasks as well, such as mode locking.

FIG. 8 illustrates application of the gain material of the present invention as an amplifier. In the system of FIG. 8, a pulsed laser 150 is provided which generates an output along path 151 at near 1.04 microns. The output on path 151 passes through the Yb:FAP gain medium 152, which is pumped by an InGaAs diode array 153. The amplifier configuration of FIG. 8 again takes advantage of the long storage lifetime provided by the gain materials of the present invention.

The present invention provides new gain materials doped with ytterbium optimized for pumping at near 0.905 microns by laser diodes or diode arrays. Therefore, efficient room temperature quasi-three-level laser systems utilizing ytterbium doped hosts have been realized.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

What is claimed is:

1. A composition of matter consisting essentially of a host and ytterbium doped in the host, said host selected from a group having the formula:

$M_5(PO_4)_3X$, where

M is a divalent cation selected from $Ca^{2+}$, $Sr^{2+}$, $Cd^{2+}$, or $Pb^{2+}$, or a combination of monovalent and trivalent ions, such as $Li^+$, $NA^+$, $K^+$, or $Rb^+$, and $Y^{3+}+La^{3+}$, $Gd^{3+}$, $Lu^{3+}$, or other $RE^{3+}$ (rare earth), and X is singly-charged anion, such as $F^-$, $Cl^-$, $Br^-$, $I^-$, $OH^-$, or one-half the fraction of doubly-charged anions, such as $O^{2-}$ or $S^{2-}$, wherein if M is $Ca^{2+}$, $Sr^{2+}$, $Li^+$, $Na^+$, $K^+$, or $Rb^+$, X is not $F^-$ or $O^{2-}$.

2. A laser gain medium comprising a host crystal and ytterbium doped in the host crystal, said crystal selected from a group having the formula:

$M_5(PO_4)_3X$, where

M is a divalent cation selected from $Ca^{2+}$, $Sr^{2+}$, $Cd^{2+}$, or $Pb^{2+}$, or a combination of monovalent and trivalent ions, such as $Li^{30}$, $Na^+$, $K^+$, or $Rb^+$, and $Y^{3+}$, $La^{3+}$, $Gd^{3+}$, $Lu^{3+}$, or other $RE^{3+}$ (rare earth), and X is singly-charged anion, such as $F^-$, $Cl^-$, $Br^-$, $I^-$, $OH^-$, or one-half the fraction of doubly-charged anions, such as $O^{2-}$ or $S^{2-}$, wherein if M is $Ca^{2+}$, $Sr^{2+}$, $Li^{2+}$, $Na^+$, $K^+$, or $Rb^+$, X is not $F^-$ or $O^{2-}$.

3. A laser gain apparatus, comprising:

a laser gain material comprising ytterbium doped fluoro-apatite; and means, in optical communication with the gain material, for supplying pump energy to the gain material, said means comprising a narrowband source of radiation near 0.095 microns or 0.98 microns.

4. The laser gain apparatus of claim 3, wherein the narrowband source comprises a diode laser.

5. The laser gain apparatus of claim 4, wherein the diode laser includes an InGaAs diode.

6. The laser gain apparatus of claim 4, wherein the diode laser includes an AlInGaAs diode.

7. The laser gain apparatus of claim 3, further including:

a source of coherent radiation near 1.04 microns incident on the gain material, so that the coherent radiation is amplified in the gain material.

8. The laser apparatus of claim 3, wherein the means for supplying pump energy, supplies energy sufficient to induce a substantially ground state depletion mode in the gain material.

9. A laser gain apparatus, comprising:

a laser gain material comprising a host crystal and ytterbium doped in the host crystal, said crystal selected from a group having the formula:

$M_5(PO_4)_3X$, where

M is a divalent cation selected from $Ca^{2+}$, $Sr^{2+}$, $Cd^{2+}$, or $Pb^{2+}$, or a combination of monovalent and trivalent ions, such as $Li^{30}$, $Na^+$, $K^+$, or $Rb^+$, and $Y^{3+}$, $La^{3+}$, $Gd^{3+}$, $Lu^{3+}$, or other $RE^{3+}$ (rare earth), and X is singly-charged anion, such as $F^-$, $Cl^-$, $Br^-$, $I^-$, $OH^-$, or one-half the fraction of doubly-charged anions, such as $O^{2-}$ or $S^{2-}$; and means, in optical communication with the gain material, for supplying pump energy to the gain material, said means comprising a narrowband source of radiation near 0.905 microns or 0.98 microns.

10. The laser gain apparatus of claim 9, wherein the narrowband source comprises a diode laser.

11. The laser gain apparatus of claim 10, wherein the diode laser includes an InGaAs diode.

12. The laser gain apparatus of claim 10, wherein the diode laser includes an AlInGaAs diode.

13. The laser gain apparatus of claim 9, further including:

a source of coherent radiation near 1.04 microns incident on the gain material, so that the coherent radiation is amplified in the gain material.

14. The laser apparatus of claim 9, wherein the means for supplying pump energy, supplies energy sufficient to induce a substantially ground state depletion mode in the gain material.

15. A laser comprising:

a resonant cavity having an output coupler;

a laser gain material comprising ytterbium doped fluoro-apatite mounted within the resonant cavity; and means, in optical communication with the gain material, for supplying pump energy to the gain material, said means comprising a narrowband source of radiation near 0.905 microns or 0.98 microns.

16. The laser of claim 15, further including:

a Q-switch mounted within the resonant cavity.

17. The laser of claim 16, wherein the means for supplying pump energy, supplies energy sufficient to induce a substantially ground state depletion mode in the gain material.

18. The laser of claim 15, wherein the narrowband source comprises a diode laser.

19. The laser of claim 18, wherein the diode laser includes an InGaAs diode.

20. The laser of claim 18, wherein the diode laser includes an AlInGaAs diode.

21. A laser comprising:

a resonant cavity having an output coupler;

a laser gain material comprising a host crystal mounted within the resonant cavity and ytterbium doped in the host crystal, said crystal selected from a group having the formula:

$$M_5(PO_4)_3X,$$

where

M is a divalent cation selected from $Ca^{2+}$, $Sr^{2+}$, $Cd^{2+}$, or $Pb^{2+}$, or a combination of monovalent and trivalent ions, such as $Li^{30}$, $Na^+$, $K^+$, or $Rb^+$, and $Y^{3+}$, $La^{3+}$, $Gd^{3+}$, $Lu^{3+}$, or other $RE^{3+}$ (rare earth), and X is singly-charged anion, such as $F^-$, $Cl^-$, $Br^-$, $I^-$, $OH^-$, or one-half the fraction of doubly-charged anions, such as $O^{2-}$ or $S^{2-}$, wherein if M is $Ca^{2+}$, $Sr^{2+}$, $Li^+$, $Na^+$, $Na^+$, $K^+$, or $Rb^+$, X is not $F^-$ or $O^{2-}$;

means, in optical communication with the gain material, for supplying pump energy to the gain material.

22. The laser of claim 21, further including:

a Q-switch mounted within the resonant cavity.

23. The laser of claim 21, wherein the means for supplying pump energy comprises a narrowband source of radiation near 0.905 microns.

24. The laser of claim 23, wherein the narrowband source comprises a diode laser.

25. The laser of claim 24, wherein the diode laser includes an InGaAs diode.

26. The laser of claim 24, wherein the diode laser includes an AlInGaAs diode.

27. The laser of claim 21, wherein the means for supplying pump energy comprises a narrowband source of radiation near 0.98 microns.

28. The laser of claim 21, wherein the means for supplying pump energy, supplies energy sufficient to induce a substantially ground state depletion mode in the gain material.

29. An ytterbium doped laser gain medium having $I_{min}$ less than about 1.0 kW/cm² at near 0.905 microns, where $I_{min}$ is a minimum pump intensity required to induce gain, and an emission cross-section $\sigma_{em}$ greater than about $2.0 \times 10^{-20}$ cm² at near 1.04 microns.

30. The gain medium of claim 29, wherein $I_{min}$ is less than about 0.3 kW/cm², and $\sigma_{em}$ is greater than about $3.0 \times 10^{-20}$ cm².

31. The gain medium of claim 29, wherein $I_{min}$ is less than about 0.2 kW/cm², and $\sigma_{em}$ is greater than about $5.0 \times 10^{-20}$ cm².

32. A method for inducing laser gain comprising energizing a composition comprising a host crystal and ytterbium doped in the host crystal, said crystal selected from a group having the formula:

$$M_5(PO_4)_3X,$$

where

M is a divalent cation selected from $Ca^{2+}$, $Sr^{2+}$, $Cd^{2+}$, or $Pb^{2+}$, or a combination of monovalent and trivalent ions, such as $Li^{30}$, $Na^+$, $K^+$, or $Rb^+$, and $Y^{3+}$, $La^{3+}$, $Gd^{3+}$, $Lu^{3+}$, or other $RE^{3+}$ (rare earth), and X is singly-charged anion, such as $F^-$, $Cl^-$, $Br^-$, $I^-$, $OH^-$, or one-half the fraction of doubly-charged anions, such as $O^{2-}$ or $S^{2-}$, wherein if M is $Ca^{2+}$, $Sr^{2+}$, $Li^+$, $Na^+$, $Na^+$, $K^+$, or $Rb^+$, X is not $F^-$ or $O^{2-}$.

* * * * *